(12) United States Patent
Lin

(10) Patent No.: US 11,664,481 B2
(45) Date of Patent: May 30, 2023

(54) DISPLAY DEVICE

(71) Applicant: MACROBLOCK, INC., Hsinchu (TW)

(72) Inventor: Yi-Sheng Lin, Hsinchu (TW)

(73) Assignee: MACROBLOCK, INC., Hsinchu (TW)

( * ) Notice: Subject to any disclaimer, the term of this patent is extended or adjusted under 35 U.S.C. 154(b) by 154 days.

(21) Appl. No.: 17/248,532

(22) Filed: Jan. 28, 2021

(65) Prior Publication Data
US 2021/0257520 A1    Aug. 19, 2021

(30) Foreign Application Priority Data
Feb. 15, 2020   (TW) .................................. 109104889

(51) Int. Cl.
*H01L 33/48*     (2010.01)
*H01L 33/62*     (2010.01)
*H01L 27/15*     (2006.01)

(52) U.S. Cl.
CPC .......... *H01L 33/486* (2013.01); *H01L 27/156* (2013.01); *H01L 33/62* (2013.01)

(58) Field of Classification Search
CPC ...... H01L 33/486; H01L 27/156; H01L 33/62
See application file for complete search history.

(56) References Cited

U.S. PATENT DOCUMENTS

| 10,332,462 B2 | 6/2019 | Takahashi |
| 2003/0062545 A1* | 4/2003 | Yamazaki ............. H01L 27/124 257/200 |
| 2020/0066942 A1* | 2/2020 | Wang ..................... H01L 27/156 |

FOREIGN PATENT DOCUMENTS

| CN | 206684448 | 11/2017 |
| CN | 109493811 | 3/2019 |
| TW | I682224 B | 1/2020 |

OTHER PUBLICATIONS

Taiwan Intellectual Property Office, "Search Report appended to an Office Action," along with English translation thereof, issued to Taiwanese patent application No. 109104889, dated Sep. 21, 2020, document of 2 pages.

* cited by examiner

*Primary Examiner* — Feifei Yeung Lopez
(74) *Attorney, Agent, or Firm* — Akerman LLP; Peter A. Chiabotti

(57) ABSTRACT

A display device includes a carrier, a substrate unit, a plurality of light emitting elements and a circuit unit. The carrier has a top surface and a bottom surface opposite to each other, and a peripheral surface interconnecting the top and bottom surfaces. The substrate unit is disposed on one side of the peripheral surface of the carrier. The light emitting elements are spacedly disposed on the top surface of the carrier. The circuit unit includes a plurality of circuit modules that are disposed on the substrate unit and that are electrically connected to the light emitting elements. Each of the circuit modules includes a switch control circuit and a driving circuit that are configured to control the light emitting elements.

22 Claims, 6 Drawing Sheets

DISPLAY DEVICE

CROSS-REFERENCE TO RELATED APPLICATION

This application claims priority of Taiwanese Invention Patent Application No. 109104889, filed on Feb. 15, 2020.

FIELD

The disclosure relates to a display device, and more particularly to a display device including a light source and a circuit unit disposed on different supporting members.

BACKGROUND

A conventional display device includes a plurality of display panels, each of which contains a circuit board having opposite top and bottom surfaces, a plurality of light emitting diodes (LEDs) that are disposed on the top surface of the circuit board, and a plurality of circuit modules that are disposed on the bottom surface of the circuit board and that are electrically connected to the LEDs so as to control the luminescence characteristics of the LEDs.

As there is a growing trend in development of display devices with high resolution, the amount of the LEDs and the amount or pins of the corresponding circuit modules per unit area on each of the display panels are thereby increased.

However, in order to dispose the LEDs and the circuit modules on the opposite top and bottom surfaces of the circuit board in a relatively high density, the amounts of output pins and input pins will be inevitably increased, and the corresponding circuit layouts will become more complicated. Therefore, the circuit board is generally fabricated to have a multi-layered structure (such as 8 to 10 or more composite layers), so as to cope with the high density of the LED settings and the complicated circuit layouts, which in turn might increase the difficulty of manufacturing the display device and incur a high manufacturing cost.

SUMMARY

Therefore, an object of the disclosure is to provide a display device that can alleviate at least one of the drawbacks of the prior art.

According to the disclosure, the display device includes a carrier, a substrate unit, a plurality of light emitting elements and a circuit unit.

The carrier has a top surface and a bottom surface opposite to each other, and a peripheral surface interconnecting the top and bottom surfaces. The substrate unit is disposed on one side of the peripheral surface of the carrier. The light emitting elements are spacedly disposed on the top surface of the carrier. The circuit unit includes a plurality of circuit modules that are disposed on the substrate unit and that are electrically connected to the light emitting elements. Each of the circuit modules includes a switch control circuit and a driving circuit that are configured to control the light emitting elements.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
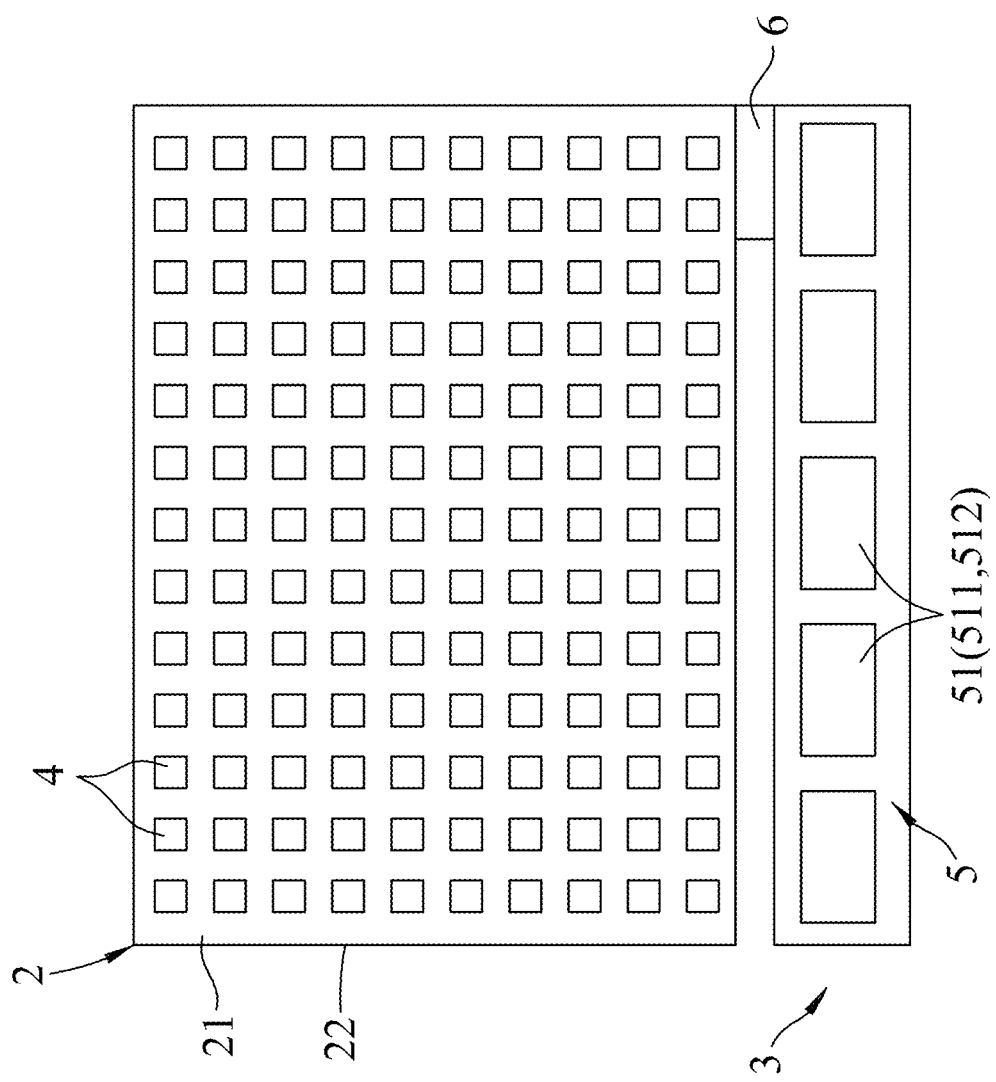
FIG. 1 is a top schematic view illustrating a first embodiment of a display device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of the display device according to this disclosure includes a carrier 2, a substrate unit 3, a plurality of light emitting elements 4, a circuit unit 5 and an electrical connection unit 6.

The carrier 2 has a top surface 21 and a bottom surface opposite to each other, and a peripheral surface 22 interconnecting the top surface 21 and the bottom surface. The carrier 2 may be a printed circuit board, a glass board, or a wafer, but is not limited thereto.

The substrate unit 3 is disposed on one side of the peripheral surface of the carrier 2, and is spaced apart from the carrier 2. The substrate unit 3 may be a printed circuit board, a glass board, and a polyimide film, but is not limited thereto.

The light emitting elements 4 are spacedly disposed on the top surface of the carrier 2. Each of the light emitting elements 4 may be a light-emitting diode (LED), such as a micro LED.

The circuit unit 5 includes a plurality of circuit modules 51 that are disposed on the substrate unit 3 and that are electrically connected to the light emitting elements 4. Each of the circuit modules 51 may include a switch control circuit 511 and a driving circuit 512 that are configured to control the light emitting elements 4. In this embodiment, the switch control circuit 511 and the driving circuit 512 are arranged together, so as to coordinate a plurality of the circuit modules 51 on the substrate unit 3.

The electrical connection unit 6 is configured to electrically connect the light emitting elements 4 to the circuit unit 5. An example of the electrical connection unit 6 may be, but is not limited to, an electrical cable.

In this embodiment, by virtue of disposing the light emitting elements 4 and the circuit unit 5 respectively on the carrier 2 and the substrate unit 3 (i.e., on different supporting members), the display device having reduced number of layers and thickness can be manufactured, so as to simplify the manufacturing process and to lower the manufacturing cost, thereby enhancing the manufacturing yield.

Figure 2:
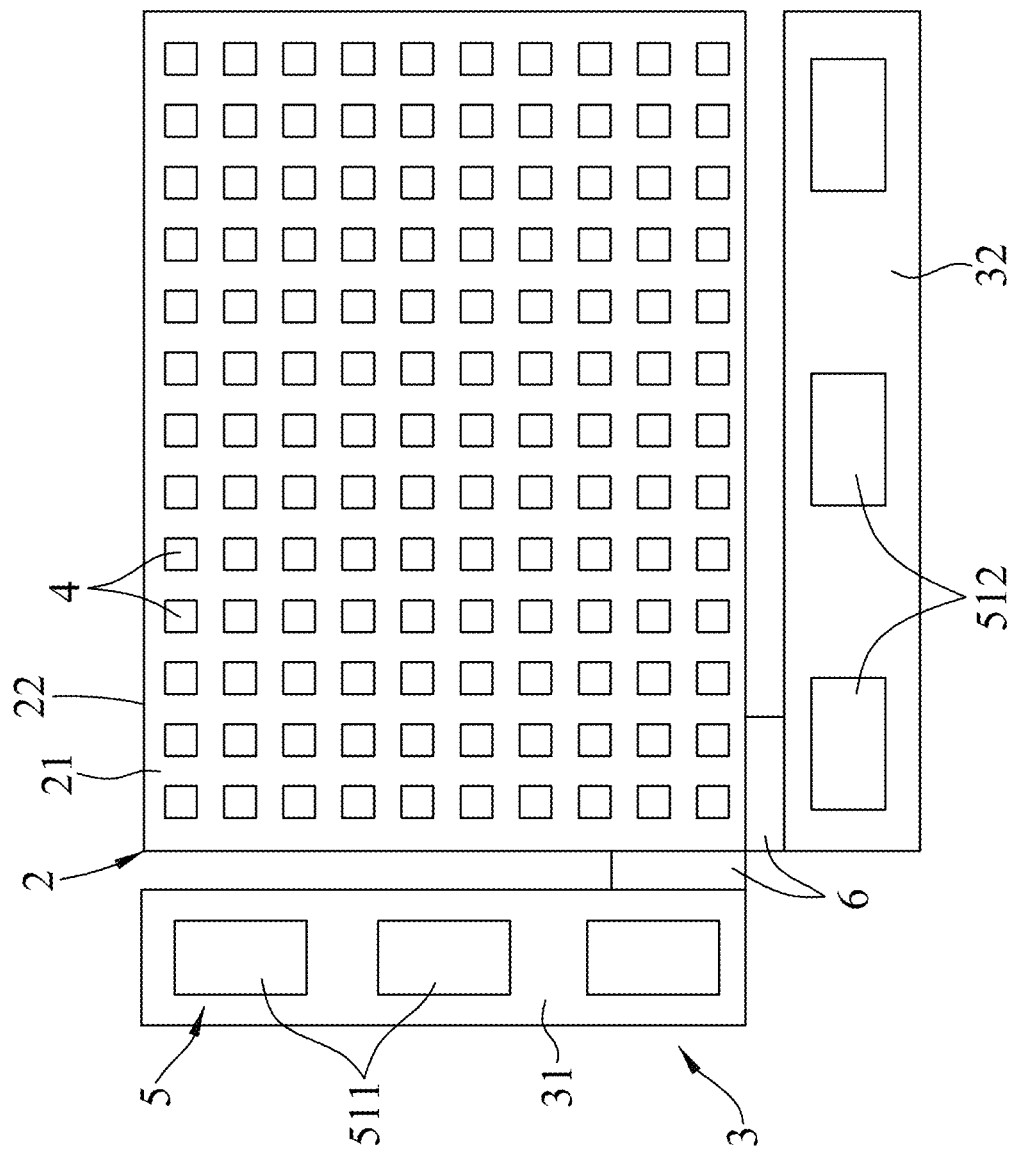
FIG. 2 is a top schematic view illustrating a second embodiment of the display device according to the disclosure.
Figure 3:
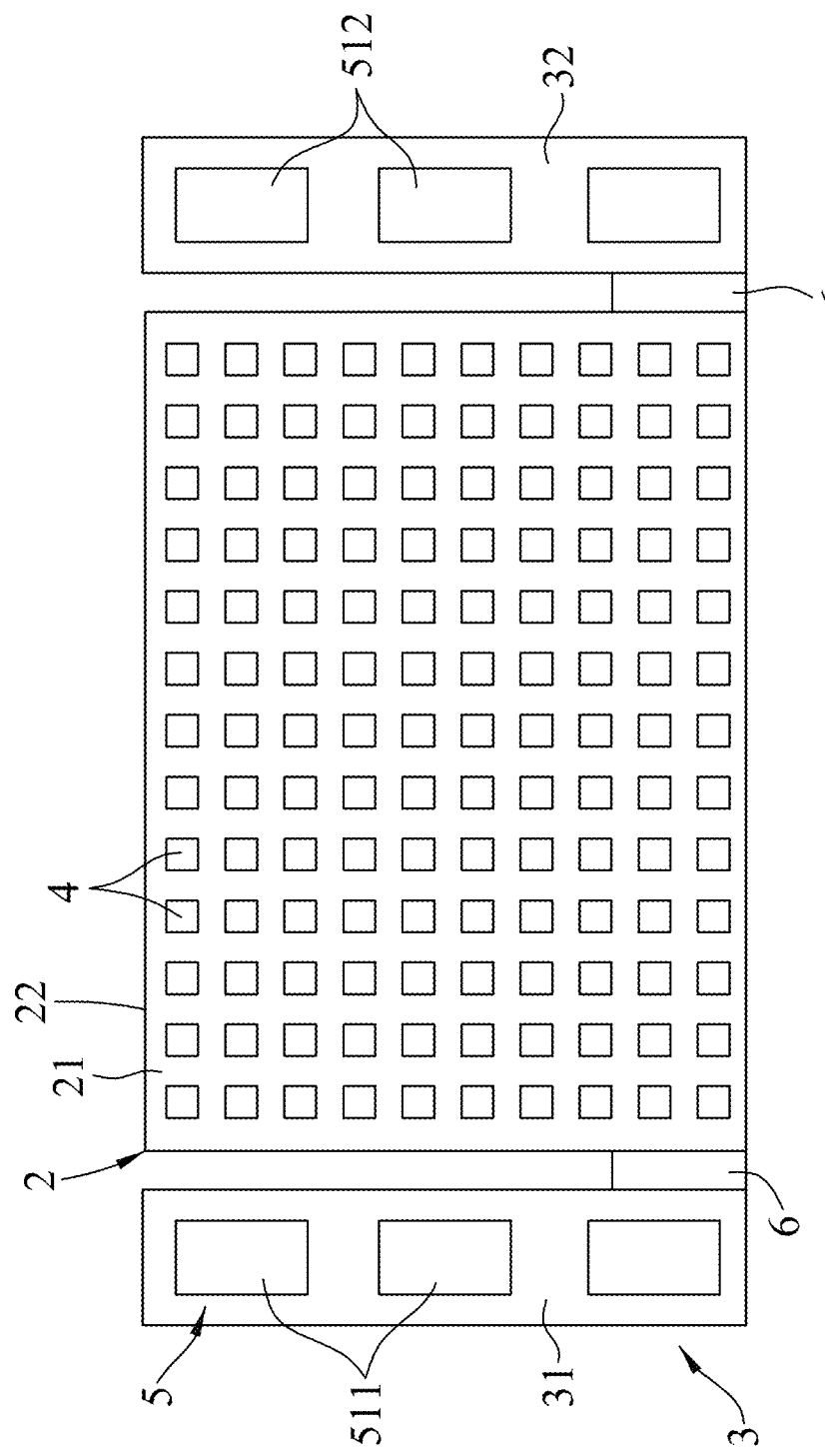
FIG. 3 is a top schematic view illustrating a variation of the second embodiment of the display device according to the disclosure.
Figure 4:
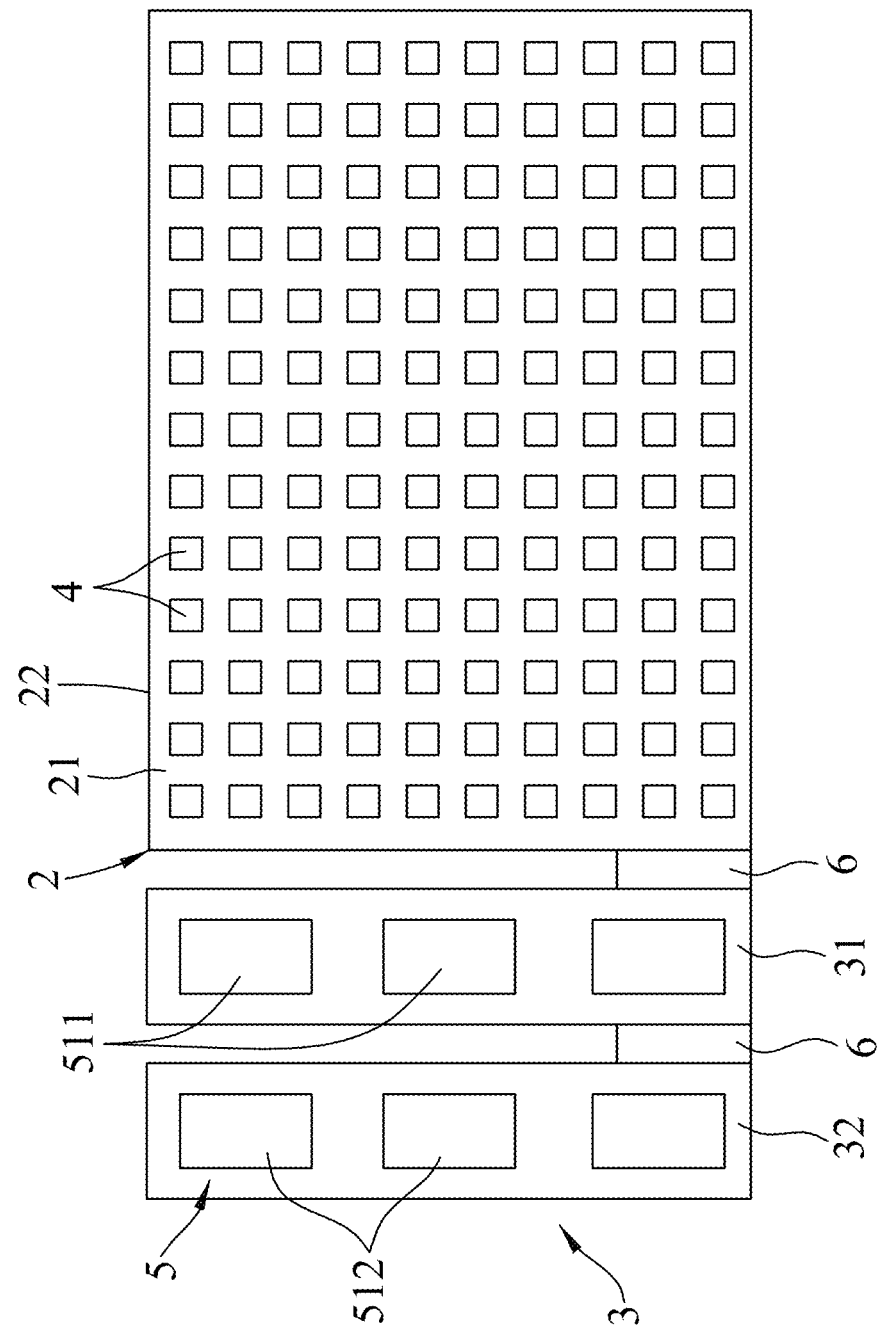
FIG. 4 is a top schematic view illustrating another variation of the second embodiment of the display device according to the disclosure.

Referring to FIG. 2 to FIG. 4, a second embodiment of the display device according to this disclosure is similar to the first embodiment, except that in the second embodiment, the substrate unit 3 includes a first substrate 31 and a second substrate 32, and the switch control circuit 511 and the driving circuit 512 are separated from each other and are disposed on the first and the second substrates 31, 32, respectively.

The first substrate 31 and the second substrate 32 may be located at different sides of the peripheral surface 22 of the carrier 2. In this embodiment, the peripheral surface 22 of the carrier 2 is in a rectangular shape, and the first and second substrates 31, 32 are located on two adjacent sides of the peripheral surface 22. The switch control circuit 511 and the driving circuit 512 respectively disposed on the first and second substrates 31, 32 are electrically connected to the light emitting elements 4 on the carrier 2 through the electrical connection unit 6.

It should be noted that, the location of the first and the second substrates 31, 32 on the peripheral surface 22 are not specifically limited, and may be varied according the practical requirement. For example, in a variation of the second embodiment, the first and the second substrates 31, 32 are disposed on opposite sides of the peripheral surface 22 of the carrier 2 (see FIG. 3). In another variation of the second embodiment, the first and the second substrates 31, 32 are disposed on the same side of the peripheral surface 22 of the carrier 2 (see FIG. 4).

Figure 5:
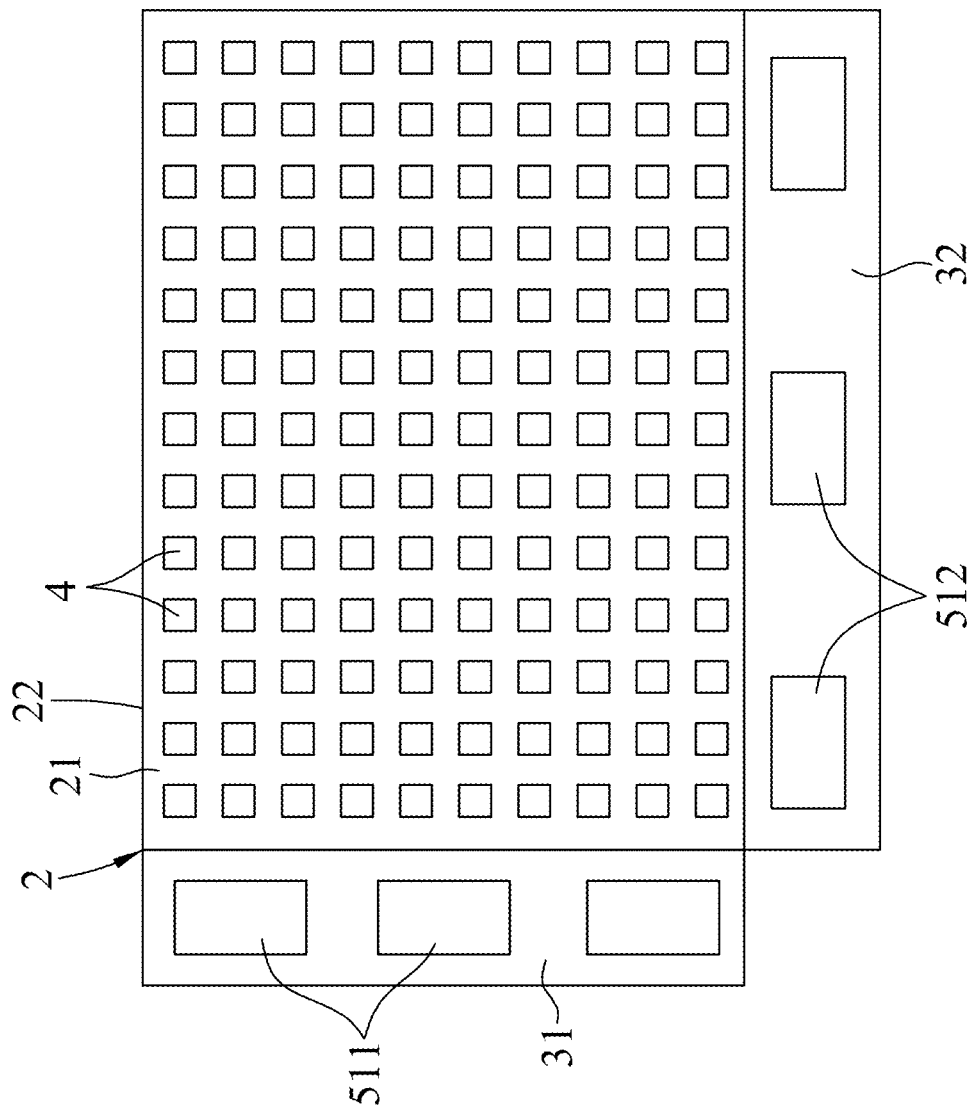
FIG. 5 is a top schematic view illustrating yet another variation of the second embodiment of the display device according to the disclosure.

Referring to FIG. 5, in yet another variation of the second embodiment, each of the first substrate 31 and the second substrate 32 is a film made of a soft material, and is directly attached to the peripheral surface 22 of the carrier 2 without the electrical connection unit 6.

Figure 6:
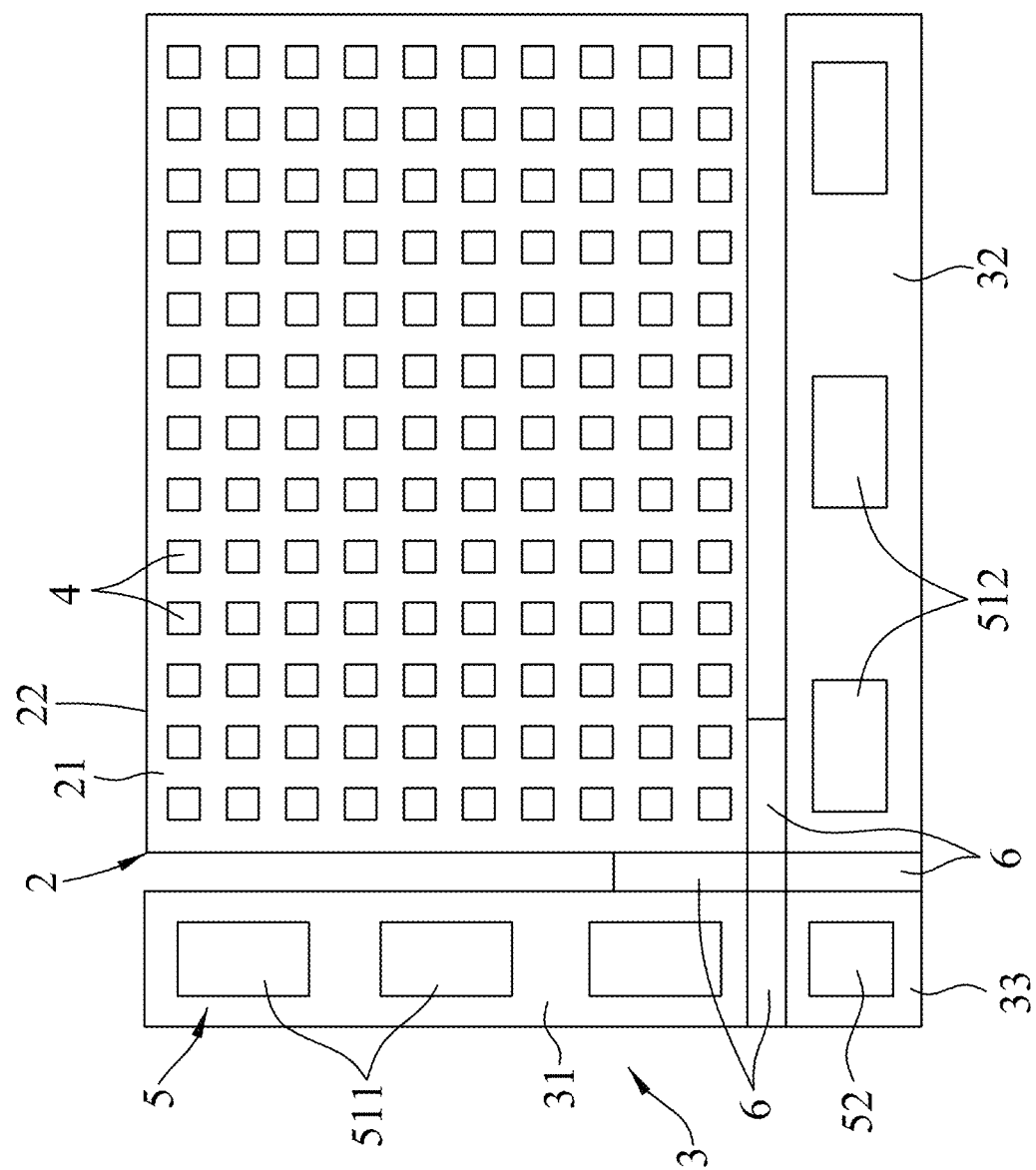
FIG. 6 is a top schematic view illustrating a third embodiment of the display device according to the disclosure.

Referring to FIG. 6, a third embodiment of the display device according to this disclosure is similar to the second embodiment, except that in the third embodiment, the substrate unit 3 further includes a third substrate 33, and the circuit unit 5 further includes a sequential control circuit 52 which is disposed on the third substrate 33 and which is electrically connected to the switch control circuit 511 and the driving circuit 512.

Specifically, the third substrate 33 is disposed between the first substrate 31 and the second substrate 32, and the sequential control circuit 52 is electrically connected to the switch control circuit 511 and the driving circuit 512 via the electrical connection unit 6. It should be noted that the location of the sequential control circuit 52 is not limited specifically, and may be varied based on practical requirements. For example, the sequential control circuit 52 may be disposed on the first substrate 31 and/or the second substrate 32. In such case, the third substrate 33 may be omitted therefrom.

In sum, by way of disposing the light emitting elements 4 and the circuit unit 5 respectively on the carrier 2 and the substrate unit 3 (i.e., on different supporting members), the display device of this disclosure can be manufactured with reduced number of layers and thickness, so that the manufacturing process and cost thereof can be greatly reduced, thereby improving the manufacturing yield.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A display device, comprising:
a carrier which has a top surface and a bottom surface opposite to each other, and a peripheral surface interconnecting said top surface and said bottom surface;
a substrate unit which is disposed on one side of said peripheral surface of said carrier;
a plurality of light emitting elements which are spacedly disposed on said top surface of said carrier; and
a circuit unit which includes a plurality of circuit modules that are disposed on said substrate unit and that are electrically connected to said light emitting elements, each of said circuit modules including a switch control circuit and a driving circuit that are configured to control said light emitting elements;
wherein said substrate unit includes a first substrate and a second substrate, said switch control circuit and said driving circuit being disposed on said first and second substrates, respectively.

2. A display device, comprising:
a carrier which has a top surface and a bottom surface opposite to each other, and a peripheral surface interconnecting said top surface and said bottom surface;
a substrate unit which is disposed on one side of said peripheral surface of said carrier;
a plurality of light emitting elements which are spacedly disposed on said top surface of said carrier; and
a circuit unit which includes a plurality of circuit modules that are disposed on said substrate unit and that are electrically connected to said light emitting elements, each of said circuit modules including a switch control circuit and a driving circuit that are configured to control said light emitting elements;
wherein said substrate unit is directly attached to said peripheral surface of said carrier.

3. The display device according to claim 1, wherein said first substrate and said second substrate are located on a same side of said peripheral surface of said carrier.

4. The display device according to claim 1, wherein said first substrate and said second substrate are located on different sides of said peripheral surface of said carrier.

5. The display device according to claim 1, wherein said circuit unit further includes a sequential control circuit which is electrically connected to said switch control circuit and said driving circuit.

6. The display device according to claim 5, wherein said sequential control circuit is disposed on one of said first substrate and said second substrate.

7. The display device according to claim 5, wherein said substrate unit further includes a third substrate on which said sequential control circuit is disposed.

8. The display device according to claim 1, wherein said carrier and said substrate unit are spaced apart from each other, and said display device further comprises an electrical connection unit that is configured to electrically connect said light emitting elements to said circuit unit.

9. The display device according to claim 1, wherein said substrate unit is directly attached to said peripheral surface of said carrier.

10. The display device according to claim 1, wherein said carrier is selected from the group consisting of a printed circuit board, a glass board, and a wafer.

11. The display device according to claim 1, wherein said substrate unit is selected from the group consisting of a printed circuit board, a glass board, and a polyimide film.

12. The display device according to claim 1, wherein each of said light emitting elements is a light-emitting diode (LED).

13. The display device according to claim 12, wherein said LED is a micro LED.

14. The display device according to claim 2, wherein said substrate unit includes a first substrate and a second substrate that are located on a same side of said peripheral surface of said carrier, said switch control circuit and said driving circuit being disposed on said first and second substrates, respectively.

15. The display device according to claim 2, wherein said substrate unit includes a first substrate and a second substrate that are located on different sides of said peripheral surface of said carrier, said switch control circuit and said driving circuit being disposed on said first and second substrates, respectively.

16. The display device according to claim 2, wherein said circuit unit further includes a sequential control circuit which is electrically connected to said switch control circuit and said driving circuit.

17. The display device according to claim 16, wherein said substrate unit includes a first substrate and a second substrate, said switch control circuit and said driving circuit being disposed on said first and second substrates, respectively, said sequential control circuit being disposed on one of said first substrate and said second substrate.

18. The display device according to claim 16, wherein said substrate unit includes a first substrate, a second substrate and a third substrate, said switch control circuit, said driving circuit, and said sequential control circuit being disposed on said first, second and third substrates, respectively.

19. The display device according to claim 2, wherein said carrier is selected from the group consisting of a printed circuit board, a glass board, and a wafer.

20. The display device according to claim 2, wherein said substrate unit is selected from the group consisting of a printed circuit board, a glass board, and a polyimide film.

21. The display device according to claim 2, wherein each of said light emitting elements is a light-emitting diode (LED).

22. The display device according to claim 2, wherein said LED is a micro LED.

\* \* \* \* \*